US012789780B2

(12) United States Patent
Hammond et al.

(10) Patent No.: US 12,789,780 B2
(45) Date of Patent: Nov. 10, 2026

(54) E-STOP RELAY SYSTEM WITH FAILURE DETECTION AND INDICATION

(71) Applicant: Oshkosh Corporation, Oshkosh, WI (US)

(72) Inventors: Christopher Hammond, Sputh Lyon, MI (US); Benjamin J. LeVesque, Royal Oak, MI (US); Steven Hechtman, Ann Arbor, MI (US)

(73) Assignee: Oshkosh Corporation, Oshkosh, WI (US)

( * ) Notice: Subject to any disclaimer, the term of this patent is extended or adjusted under 35 U.S.C. 154(b) by 195 days.

(21) Appl. No.: 18/759,136

(22) Filed: Jun. 28, 2024

(65) Prior Publication Data

US 2025/0001994 A1 Jan. 2, 2025

Related U.S. Application Data

(60) Provisional application No. 63/524,105, filed on Jun. 29, 2023.

(51) Int. Cl.

*B60T 17/22* (2006.01)
*G01R 31/00* (2006.01)
*G01R 31/327* (2006.01)

(52) U.S. Cl.

CPC ............ *B60T 17/22* (2013.01); *G01R 31/007* (2013.01); *G01R 31/3278* (2013.01)

(58) Field of Classification Search

CPC .... B60T 17/22; G01R 31/007; G01R 31/3278
See application file for complete search history.

(56) References Cited

U.S. PATENT DOCUMENTS

2010/0117585 A1* 5/2010 Fitch ........................ B25J 13/06 361/114
2017/0015200 A1* 1/2017 Hatanaka ................ B60L 53/16
2023/0178976 A1* 6/2023 Nakagawa ............ H02H 5/042 361/106

* cited by examiner

*Primary Examiner* — Alvaro E Fortich
(74) *Attorney, Agent, or Firm* — Foley & Lardner LLP

(57) ABSTRACT

An e-stop relay system can include a relay junction and a circuit. The relay junction can include a relay to control an operation of a vehicle. The circuit can communicate with the relay junction. The circuit can receive a plurality of signals that correspond to operation of the relay, detect that at least one portion of the e-stop relay system has failed, and transmit one or more signals to a light source to cause the light source to produce light that indicates that the at least one portion of the e-stop relay system has failed.

12 Claims, 15 Drawing Sheets

700

| ESTOP 1 | ESTOP 2 | AND | IN x | OUT x | XOR | E-Stop_ISO | E-Stop_DIAG | Relay Fault |
|---|---|---|---|---|---|---|---|---|
| 0 | 0 | 0 | 0 | 0 | 0 | 0 | 1 | No |
| 0 | 0 | 0 | 0 | 1 | 1 | 0 | 1 | No |
| 0 | 0 | 0 | 1 | 0 | 1 | 0 | 1 | No |
| 0 | 0 | 0 | 1 | 1 | 0 | 0 | 1 | Maybe |
| 0 | 1 | 0 | 0 | 0 | 0 | 0 | 1 | No |
| 0 | 1 | 0 | 0 | 1 | 1 | 0 | 1 | No |
| 0 | 1 | 0 | 1 | 0 | 1 | 0 | 1 | No |
| 0 | 1 | 0 | 1 | 1 | 0 | 0 | 1 | Maybe |
| 1 | 0 | 0 | 0 | 0 | 0 | 0 | 1 | No |
| 1 | 0 | 0 | 0 | 1 | 1 | 0 | 1 | No |
| 1 | 0 | 0 | 1 | 0 | 1 | 0 | 1 | No |
| 1 | 0 | 0 | 1 | 1 | 0 | 0 | 1 | Maybe |
| 1 | 1 | 1 | 0 | 0 | 0 | 1 | 1 | No |
| 1 | 1 | 1 | 0 | 1 | 1 | 1 | 0 | Yes |
| 1 | 1 | 1 | 1 | 0 | 1 | 1 | 0 | Yes |
| 1 | 1 | 1 | 1 | 1 | 0 | 1 | 1 | No |

FIG. 7

E-STOP RELAY SYSTEM WITH FAILURE DETECTION AND INDICATION

CROSS-REFERENCE TO RELATED PATENT APPLICATIONS

This application claims the benefit of and priority to U.S. Provisional Patent Application No. 63/524,105, filed on Jun. 29, 2023, the entirety of which is incorporated by reference herein.

BACKGROUND

Vehicles can include control systems and the control systems may control one or more components.

SUMMARY

One embodiment relates to an e-stop relay system. The e-stop relay system can include a relay junction. The relay junction can include a relay to control operation of a vehicle. The e-stop relay system can include a circuit. The circuit can communicate with the relay junction. The circuit can receive a plurality of signals that correspond to operation of the relay. The circuit can detect, using at least one signal of the plurality of signals, that at least one portion of the e-stop relay system has failed. The circuit can transmit one or more signals to a light source to cause the light source to produce light that indicates that the at least one portion of the e-stop relay system has failed.

In some embodiments, the circuit can include a plurality of logic gates. A first logic gate of the plurality of logic gates can be communicably coupled with the light source such that the light source receives the one or more signals from the first logic gate. The light source can produce light having a given color or illumination amount to indicate that the at least one portion of the e-stop relay system has failed.

In some embodiments, the relay junction can include a second relay coupled with the first relay. The relay and the second relay can be controllable by the plurality of signals. The relay and the second array can be arranged such that failure in the at least one portion of the e-stop relay prevents the operation of the vehicle.

In some embodiments, the relay junction can include a second relay having one or more terminals. The one or more terminals of the second relay can be coupled with one or more terminals of the relay. The one or more terminals of the second relay configured to receive one or more control signals to control the operation of the vehicle responsive to detecting that the at least one portion of the e-stop relay system has failed.

In some embodiments, the at least one portion of the e-stop relay system can include the relay. The circuit can detect that the at least one portion of the e-stop relay system has failed in response to the relay being welded.

In some embodiments, the circuit can compare a first signal of the plurality of signals pertaining to a first portion of the e-stop relay system of the vehicle with a second signal of the plurality of signals pertaining to a second portion of the e-stop relay system of the vehicle. The circuit can determine, responsive to comparison of the first signal with the second signal, that a difference between the first signal and the second signal indicates that the at least one portion of the e-stop relay system has failed.

In some embodiments, the circuit can determine, based on a difference between the at least one signal of the plurality of signals and at least one second signal of the plurality of signals, that at least one second portion of the e-stop relay system of the vehicle has also failed. The circuit can prevent, responsive to detection that the at least one portion of the e-stop relay system of the vehicle has failed and that the at least one second portion of the e-stop relay system has also failed, the operation of the vehicle.

In some embodiments, the relay can include one or more coils coupled with one or more contacts of a second relay of the relay junction. The second relay can receive, via the one or more contacts, one or more control signals intended for the relay responsive to a failure in the relay.

In some embodiments, the operation of the vehicle can pertain to at least one of operating a payload of the vehicle or a weaponry action.

In some embodiments, the vehicle can be an unmanned ground vehicle.

In some embodiments, the vehicle can be a combat vehicle.

In some embodiments, the vehicle can be an access equipment vehicle.

In some embodiments, the circuit can transmit one or more second signals to a device of the vehicle or a user device that controls the vehicle. The one or more second signals can cause a user interface to display an indication that the at least one portion of the e-stop relay system has failed.

One embodiment relates to a vehicle. The vehicle can include a controllable element. The vehicle can include an e-stop relay system. The e-stop relay system can control the controllable element. The e-stop relay system can include a relay junction. The relay junction can include a relay to control an operation of the vehicle. The e-stop relay system can include a circuit. The circuit can communicate with the relay junction. The circuit can receive a plurality of signals that correspond to operation of the relay. The circuit can detect, using at least one signal of the plurality of signals, that at least one portion of the e-stop relay system has failed. The circuit can transmit one or more signals to a light source to cause the light source to produce light that indicates that the at least one portion of the e-stop relay system has failed.

In some embodiments, the relay junction can include a second relay having one or more terminals. The one or more terminals of the second relay can be coupled with one or more terminals of the relay. The one or more terminals of the second relay can receive one or more control signals to control the operation of the vehicle responsive to detecting that the at least one portion of the e-stop relay system has failed.

In some embodiments, the at least one portion of the e-stop relay system can include the relay. The circuit can detect that the at least one portion of the e-stop relay system has failed in response to the relay being welded.

In some embodiments, the circuit can compare a first signal of the plurality of signals pertaining to a first portion of the e-stop relay system of the vehicle with a second signal of the plurality of signals pertaining to a second portion of the e-stop relay system of the vehicle. The circuit can determine, responsive to comparison of the first signal with the second signal, that a difference between the first signal and the second signal indicates that the has failed.

In some embodiments, the circuit can determine, based on a difference between the at least one signal of the plurality of signals and at least one second signal of the plurality of signals, that at least one second portion of the e-stop relay system of the vehicle has also failed. The circuit can prevent, responsive to detecting that the at least one portion of the e-stop relay system of the vehicle has failed and that the at least one second portion of the e-stop relay system has also failed, the operation of the vehicle.

In some embodiments, the relay can include one or more coils coupled with one or more contacts of a second relay of the relay junction. The second relay can receive, via the one or more contacts, one or more control signals intended for the relay responsive to a failure in the relay.

One embodiment relates to a circuit. The circuit can be for an e-stop relay system. The circuit can receive a plurality of signals that correspond to operation of a relay of the e-stop relay system. The circuit can detect, using at least one signal of the plurality of signals, that at least one portion of the e-stop relay system has failed. The circuit can transmit one or more signals to a light source to cause the light source to produce light that indicates that the at least one portion of the e-stop relay system has failed.

One embodiment relates to a circuit for an e-stop relay system of a vehicle. The circuit may receive a plurality of signals corresponding to operation of the e-stop relay system of the vehicle. The circuit may also detect, using at least one signal of the plurality of signals, that at least a portion of the e-stop relay system of the vehicle has failed, and prevent, responsive to detecting that the at least a portion of the e-stop relay system of the vehicle has failed, operation of the vehicle.

In some embodiments, the circuit may detect, using the at least one signal of the plurality of signals, that the at least a portion of the e-stop relay system of the vehicle has failed by comparing a first signal of the plurality of signals pertaining to a first portion of the e-stop relay system of the vehicle with a second signal of the plurality of signals pertaining to a second portion of the e-stop relay system of the vehicle. The circuit may also detect, using the at least one signal of the plurality of signals, that the at least a portion of the e-stop relay system of the vehicle has failed by determining, responsive to comparing the first signal with the second signal, that a difference between the first signal and the second signal indicates that at least one relay of the e-stop relay system has failed, and providing, to a remote device, a warning to indicated that the at least one relay of the e-stop relay system has failed.

In some embodiments, the circuit may prevent, responsive to detecting that the at least a portion of the e-stop relay system of the vehicle has failed, operation of the vehicle by determining, based on a difference between the at least one signal of the plurality of signals and at least one second signal of the plurality of signals, that at least one second portion of the e-stop relay system of the vehicle has also failed.

At least one embodiment relates to a vehicle. The vehicle may include a system. The system may include a first circuit pertaining to a first operation of the vehicle and a second circuit pertaining to a second operation of the vehicle. The first circuit may include a plurality of components. The first circuit may receive, from the plurality of components, a plurality of signals corresponding to operation of a plurality of relays. The first circuit may generate a warning responsive to a first signal of the plurality of signals indicating a failure in a first relay of the plurality of relays, and prevent the first operation of the vehicle responsive to a second signal of the plurality of signals indicating a failure in a second relay of the plurality of relays.

In some embodiments, the first operation of the vehicle pertains to operating a payload of the vehicle, and the second operation of the vehicle pertains to operating a vehicle halt control system. In some embodiments, the payload includes a weaponry action. In some embodiment, the vehicle is an unmanned ground vehicle. In some embodiments, the unmanned ground vehicle is a combat vehicle. In some embodiments, the vehicle is an access equipment vehicle.

This summary is illustrative only and is not intended to be in any way limiting. Other aspects, inventive features, and advantages of the devices or processes described herein will become apparent in the detailed description set forth herein, taken in conjunction with the accompanying figures, wherein like reference numerals refer to like elements.

BRIEF DESCRIPTION OF THE DRAWINGS

FIG. 7 is a table including a plurality of signals provided to one or more components of the vehicle illustrated in FIG. 1, according to some embodiments.

DETAILED DESCRIPTION

Figure 1:
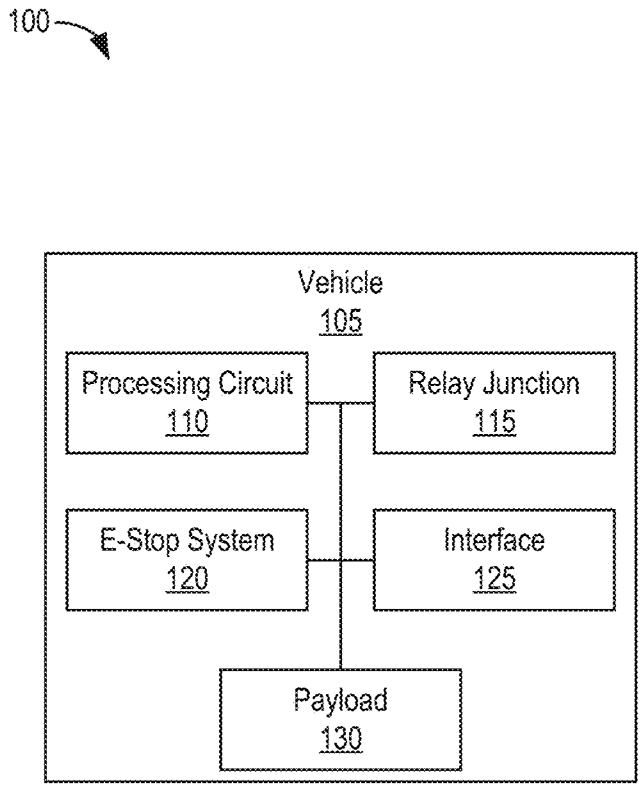
FIG. 1 is a block diagram of a vehicle including a relay junction, according to some embodiments.

Before turning to the figures, which illustrate certain exemplary embodiments in detail, it should be understood that the present disclosure is not limited to the details or methodology set forth in the description or illustrated in the figures. It should also be understood that the terminology used herein is for the purpose of description only and should not be regarded as limiting.

Referring generally to the FIGURES, a vehicle including a relay junction is shown according to exemplary embodiments. Vehicles may include control systems and the control systems may provide control signals to various components of the vehicle. The control signal may cause the various components to perform given operations and/or to cease the given operations. For example, a given control signal may cause a moveable element (e.g., an actuator, a boom arm, a telescoping arm, a motor, a turntable, tractive elements, etc.) to perform a given operation. The vehicle may be a military vehicle including armor, and weaponry (e.g., a cannon, laser weaponry, signal jammers, etc.). In some embodiments, the vehicle is a fully autonomous military vehicle that is configured to transport and operate weaponry without requiring an on-board operator. In some embodiments, the vehicle is an optionally manned military vehicle which may either be controlled autonomously (e.g., remotely) or by an on-board operator.

The control systems may implement, include, and/or otherwise carryout controlling the various components of vehicle using relays, gates, switches, latches, circuit contacts, and/or among other possible electrical devices. For example, the control systems may provide control signals to a relay switch and the control signals may cause the relay switch to perform an action (e.g., open, close, etc.). The action of the relay switch may result in a component of the vehicle performing an operation. For example, the relay switch moving from open to closed (e.g., an operation) may result in an actuator receiving power. The actuator receiving power may cause the actuator to perform an operation (e.g., retract, shorten, lengthen, extend, etc.).

During operation of the various components of the vehicle, some components of the vehicle may have trouble performing given operations. For example, a moveable element of the vehicle may have trouble moving an element of the vehicle (e.g., a platform assembly, a boom arm, a base assembly, etc.). To continue this example, the trouble experienced by the movable element may result in the vehicle and/or additional components of the vehicle being impacted. The impact on the vehicle and/or the additional components may result in complications to the vehicle. Some control system may provide signals that cause the vehicle and/or various given components of the vehicle to perform an Emergency Stop (E-stop) action. For example, the vehicle may include an E-stop relay and the control systems providing signals to the E-stop relay may cease given operations of the vehicle. The E-stop relay may also initiate other given operations of the vehicle. For example, the E-stop relay may stop a turntable from rotating and the E-stop relay may also activate a locking mechanism to maintain a position of the turntable.

The E-stop relay may include at least one switch. The switches of the E-stop relay may include at least one state. For example, the switches may include an open state and a closed state. The switches may also include a default state, a rest state, and/or an initial state. For example, a first switch of the E-stop relay may be in an open state prior to receiving signals and the first switch receiving signals may result in the first switch moving from the open state to a closed state. The first switch may repeat and/or reproduce this action (e.g., move from open state to closed state) several times.

As time progresses, switches may experience difficulty in performing their operations. For example, a switch may be a normally open switch (e.g., the switch is open absent signals) and the switch may move to a closed position as a result of receiving signals. Upon removal of the signal (e.g., the signal is no longer being transmitted), the switch may return to an open position. In some instances, the switch may be unable to return to the open position. For example, the switch may have experienced arcing, the switch may have been welded to a given gate, the switch may have been unable to decouple from a given gate, and/or among various other possible alternatives and/or combinations.

The inability for switches to return to previous states may result in the controllable action (e.g., disconnect power from a given component, activate a locking mechanism, cease movement of a given component, etc.) no longer working. For example, a switch that can electrically couple and/or electrically decouple a component from a power switch may longer be able to perform as a result of the switch's inability to move between positions. The switch's inability to perform may result in operational concerns of the vehicle.

Some of the technical solutions described herein include a relay junction that may monitor performance of relay switches and/or relay gates to detect potential failures of switches while also maintaining performance of an E-stop relay for a vehicle. For example, an access equipment vehicle (e.g., a boom lift, a scissor lift, etc.) may include a relay junction. The relay junction may include various switches and/or gates described herein. The relay junction may implement and/or execute performance of various E-stop related actions. For example, the relay junction may electrically decouple an element of the vehicle from a power source. The relay junction electrically decoupling the element of the vehicle from the power source may prevent significant damage and/or failure to the element. For example, the element may be a turntable and the turntable may move, adjust, rotate, and/or otherwise change a position of a boom arm. While the turntable is moving the boom arm, the turntable may experience difficultly and as a result the turntable may experience a fault. The turntable experiencing the fault may cause damage to the turntable. The fault may be prevented by the relay junction electrically decoupling the power source from the turntable prior to the occurrence of the fault.

During operation of various switches that may execute and/or implement various E-stop relate actions, given switches may experience welding. For example, current that flows through a circuit may produce heat and the heat may cause a given switch to weld and/or otherwise couple with a component of the circuit. The given switch having been welded to the component of the circuit may prevent the given switch from performing actions. For example, the given switch may be responsible for electrically decoupling the power source from the turntable and the welding of the given switch may prevent the given switch from electrically decoupling the power source from the turntable.

The relay junction described herein may detect that the given switch has been welded and the relay junction may also provide additional actions that may still perform to execute the action of the welded switch. For example, the relay junction may include a plurality of switches and coils of a first switch may be electrically coupled with contacts of a second switch. To continue this example, a control signal sent to coils of the first switch may also be transmitted to contacts of the second switch. The transmission of the control signals to the second switch may allow for the second switch to perform a given operation of the first switch as a result of the first switch experiencing welding. The relay junction may detect that the first switch experienced welding and as a result, the relay junction may issue a warning. Even with the first switch having experienced welding, the relay junction may still provide operations of the first switch resulting from the coils of the first switched having been electrically coupled with the contacts of the second switch.

FIG. 1 depicts a block diagram of a system 100, according to some embodiments. In some embodiments, the system 100 and/or one or more components thereof may include an e-stop relay system. The system 100 may include at least one vehicle 105. The vehicle 105 may include the vehicle described herein. In some embodiments, the vehicle 105 may include at least one of an unmanned ground vehicle, a combat vehicle, an access equipment vehicle, an autonomous vehicle, and/or among various other possible vehicles. For example, the vehicle 105 may be a boom lift (e.g., an access equipment vehicle). The vehicle 105 may include at least one processing circuit 110, at least one relay junction 115, at least one E-stop system 120, at least one interface 125, and at least one payload 130.

The processing circuit 110 may include at least one processor and memory. The processors and memory may be in communication with one another. The processors and memory may be directly coupled with one another. For example, the processors may be electrically coupled with memory. In some embodiments, memory may store instructions and the processors may execute the instructions to perform operations and/or actions similar to various components described herein. The processing circuit 110 may include various digital signal devices. For example, the processing circuit 110 may include a digital signal processor and the digital signal processor may receive various signals described herein.

The relay junction 115 may include the relay junction described herein. In some embodiments, the relay junction 115 may include at least one relay and/or switch. For example, the relay junction 115 may include a first switch and a second switch. The first switch and the second switch may be in communication with one another. For example, a first portion of the first switch may be electrically coupled with a first portion of the second switch. The relay junction 115 may include and/or be implemented as at least one circuit. For example, the relay junction may include a plurality of relays disposed within an electrical circuit. The electrical circuit may include various components of the vehicle 105. For example, the electrical circuit may include a power source and the plurality of relays may electrically couple and/or electrically decouple various components with the power source.

In some embodiments, the relay junction 115 may include one or more force guided relays. For example, a first relay and a second relay be arranged or otherwise coupled that the first relay may be prevented from opening if the second relay has been welded close. As another example, the first relay may be prevented from closing if the second relay has been welded open. As another example, the second relay may be prevented from closing if the first relay has experienced a failure (e.g., mechanical, electrical, etc.).

The E-stop system 120 may include at least one component. For example, the E-stop system 120 may include a button, a toggle, an icon on a user interface, a switch, a lever, a knob, and/or various other possible components. An operator and/or user interacting with the vehicle 105 may interface with, interact with, and/or otherwise engage with at least one component of the E-stop system 120. For example, the E-stop system 120 may include a button and an operator of the vehicle 105 may press the button to indicate activate of the E-stop system 120 (e.g., cease operation of the vehicle 105 and/or an operation of a portion of the vehicle). The E-stop system 120 may provide, responsive to the operator pressing the button, signals to the relay junction 115. In some embodiments, the interface 125 may transmit one or more signals to the E-stop system 120. For example, the interface 125 may receive one or more signals from a user device. The interface 125 may forward or otherwise provide the signals, received from the user device, to the E-stop system 120. In some embodiments, a remote operator (e.g., external to the vehicle 105) may remotely control the E-stop system 120 by providing one or more signals to the interface 125.

The relay junction 115 may receive, from the E-stop system 120, signals that cause the plurality of relays to perform given operations. For example, the signals from the E-stop system 120 may cause a first switch to open and the first switch opening may electrically decouple a brake release system of the vehicle 105 from a power source. The first switch electrically decoupling the brake release system from the power source may prevent the vehicle 105 from moving. For example, when the brake release system is electrically decoupled, via the first switch, from power source, the vehicle 105 may be unable to disengage its brakes. As another example, the first switch may electrically decouple an actuator from a power source such that movement of the actuator is prevented.

The interface 125 may include at least one of a Human-Machine Interface (HMI), a network interface, a communication interface, a network communication device, a communication channel device, communication interface. For example, the interface 125 may include a display and/or a dash, and an operator of the vehicle 105 may interact with the interface 125 to provide input to the vehicle 105. To continue this example, the user may select an icon on a user interface to indicate activation of an E-stop action (e.g., disengage brake release system).

As another example, the interface 125 may include wired or wireless communications interfaces (e.g., jacks, antennas, transmitters, receivers, transceivers, wire terminals, etc.) for conducting data communications between the vehicle 105 and at least one of a remote operator of the vehicle 105, a remote server, a command center, and/or a network. The interface 125 may be direct (e.g., local wired or wireless communications) and/or via a communications network. For example, the interface 125 may include an Ethernet card and port for sending and receiving data via an Ethernet-based communications link or network. The interface 125 may also include a Wi-Fi transceiver for communicating via a wireless communications network. The interface 125 may include a power line communications interface. The interface 125 may include an Ethernet interface, a USB interface, a serial communications interface, and/or a parallel communications interface.

In some embodiments, the interface 125 may interface with, interact with and/or otherwise communicate with at least one remote control system. For example, the vehicle 105 may be an unmanned ground vehicle and the vehicle 105 may communicate, via the interface 125, with a command center and/or a remote operator of the vehicle 105 to receive and/or transmit signals. To continue this example, the vehicle 105 may receive control signals, via the interface 125, from the remote operator and the control signals may cause the vehicle 105 to perform various operations.

In some embodiments, the vehicle 105 may include at least one payload 130. The payload 130 may include at least one of weaponry, cargo, equipment, and/or moveable elements. For example, the payload 130 may include a plurality of pieces of weaponry and the vehicle 105 may transport and/or implement various operations pertaining to the weaponry. As another example, the vehicle 105 may be a boom lift (e.g., an access equipment vehicle) and the payload 130 may include a boom arm. In some embodiments, operation of the vehicle 105 may include performance, execution, or operation of a weaponry action.

Figure 2:
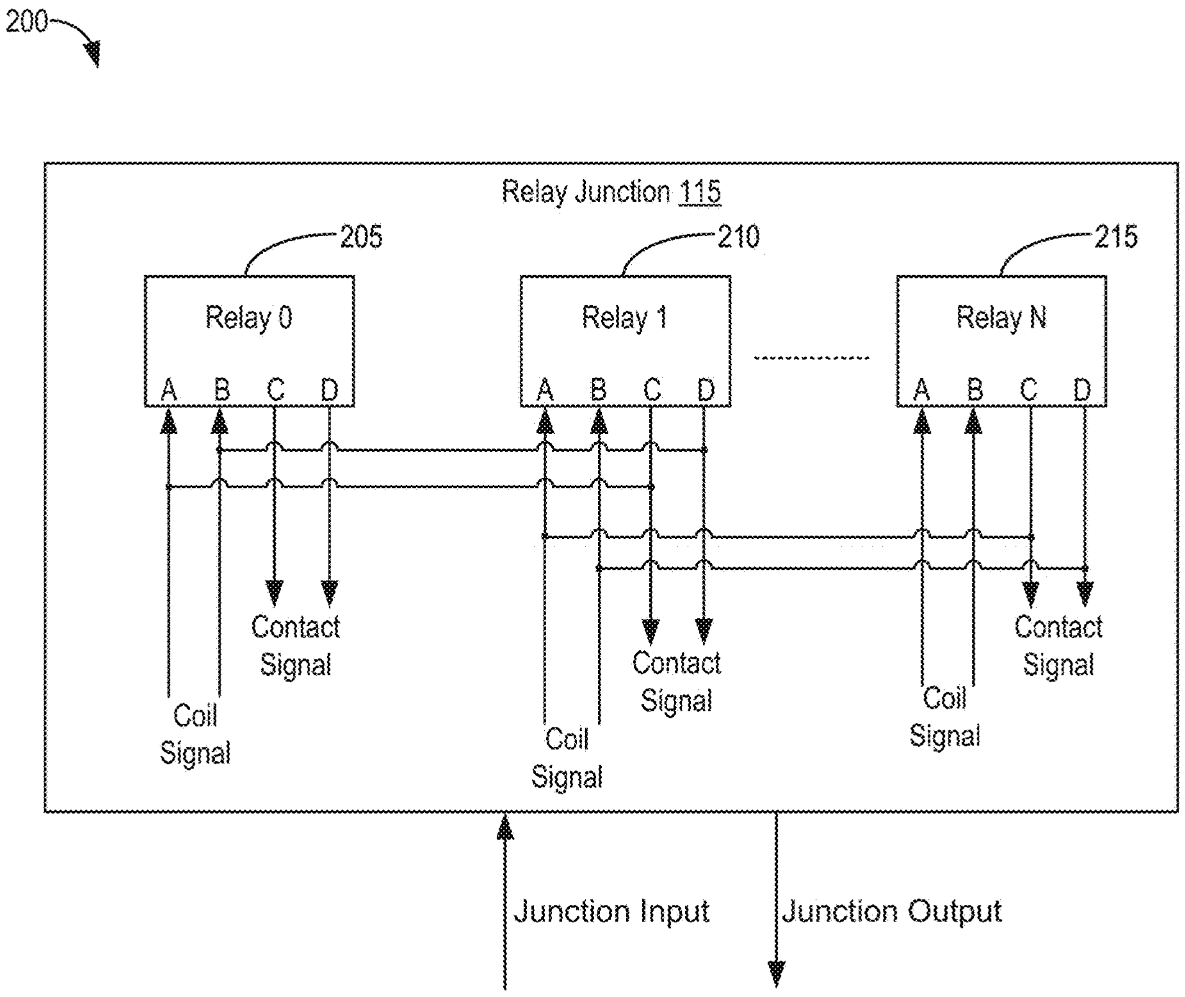
FIG. 2 is a block diagram of the relay junction illustrated in FIG. 1, according to embodiments.

FIG. 2 depicts a block diagram of a system 200, according to some embodiments. The system 200 may include the system 100 and/or various components thereof. In some embodiments, the system 200 may refer to and/or include an e-stop relay system. The system 200 may include the relay junction 115. The relay junction 115 may include at least one relay (e.g., relays 205, 210, and 215). While FIG. 2 shows the relay junction 115 including three relays (e.g., relays 205, 210, and 215), the relay junction 115 may include various numbers of relays. For example, the relay junction 115 may include ten relays. In some embodiments, the relay junction 115 may include less than three relays. In some embodiments, the relay junction may include more than three relays.

The relays 205, 210, and 215 may include at least one terminal, shown as terminals A, B, C, and D in FIG. 2. The relays may include a various number of terminals. For example, FIG. 2 shows an example of the relays include four terminals. In some embodiments, the relays may include less than four terminals. In some embodiments, the relays may include more than four terminals. In some embodiments, the terminals may include input terminals and output terminals. In some embodiments, the terminals may include a General-Purpose Input/Output (GPIO) terminal.

The terminals may receive various signals and the terminals may provide various signals. For example, the terminals may receive signals from the E-stop system 120 responsive to activation and/or deactivation of the E-stop system 120. As another example, the terminals may receive one or more signals from the interface 125. In some embodiments, the terminals may provide one or more signals to various components. For example, the terminals may provide a signal to the processing circuit 110. The terminals may provide diagnostic signals for processing by the processing circuit 110.

As shown in FIG. 2, terminals A and B correspond to coil signals and terminals C and D corresponding to contact signals. For example, the coil signals may be signals that are transmitted to and/or otherwise provided to relay coils of the relays 205, 210, and 215. The coil signals may activate at least one switch of the relays. For example, the coil signals may cause a switch to move from an open position to a closed position. The contact signals may include signals that are transmitted as a result of the switch performing an operation. For example, the contact signals may include signals that result from the switch moving from an open position to a closed position.

In some embodiments, terminals of a first relay may be coupled with terminals of a second relay. For example, FIG. 2 shows an example of terminals A and B of the relay 205 coupled with terminals C and D of the relay 210. The coil signals provided to terminals A and B of the relay 205 may also be provided to the terminals C and D of the relay 210. The coupling of the terminals between relays may provide some of the technical solutions described herein. For example, if the relay 205 were to become welded (e.g., a switch of the relay 205 is unable to open and/or close), the relay 210 would be able to carry on operation of the relay 205 responsive to the contact signals of the relay 210 having receive the coil signals from the relay 205.

The relay junction 115 may receive at least one input (shown as Junction Input in FIG. 2) and the relay junction 115 may provide at least one output (shown as Junction Output in FIG. 2). The Junction Input may include at least one of the various signals described herein. For example, the Junction Input may include signals that were provided by the E-stop system 120. The Junction Output may include at least one of the various signals described herein. For example, the Junction Output may include signals provided to the processing circuit 110.

Figure 3:
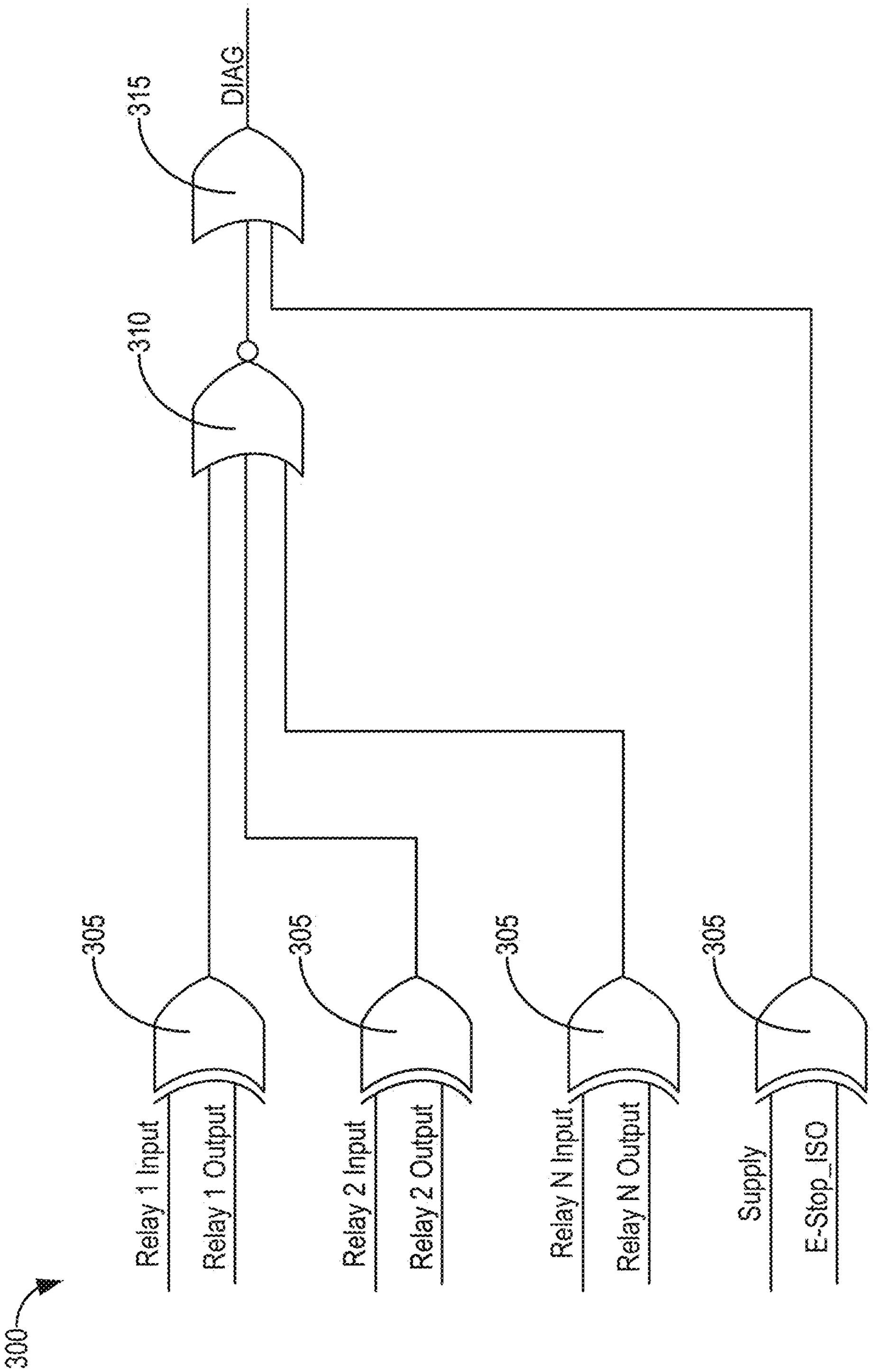
FIG. 3 is a schematic diagram of one or more components for comparing signals, according to some embodiments.

FIG. 3 depicts a schematic diagram 300, according to some embodiments. The schematic diagram 300 can include the various components described herein. In some embodiments, the schematic diagram 300 may be implemented as and/or executed within the various components described herein. For example, the relay junction 115 may include the schematic diagram 300. As another example, the processing circuit 110 may implement the schematic diagram 300 to test one or more signals provided to and/or transmitted by the relay junction 115.

In some embodiments, the schematic diagram 300 may include at least one logic gate and/or logic circuit (e.g., gates 305, 310, and 315). The logic gates 305 may receive signals corresponding to given relays of the relay junction 115. For example, a first logic gate 305 may receive signals corresponding to the relay 205. In some embodiments, the number of logic gates 305 may correspond to and/or depend from the number of relays. For example, if the relay junction 115 includes five relays, then the number of logic gates 305 may also be five.

FIG. 3 depicts an example of the schematic diagram 300 including four logic gates 305. A first logic gate 305 is shown to correspond to the relay 205, a second logic gate is shown to correspond to relay 210, a third logic gate 305 is shown to correspond to the relay 215, and a fourth logic gate 305 is shown to correspond to an E-stop signal. The first logic gate 305 may receive two inputs (shown as Relay 1 Input and Relay 2 output). The Relay 1 Input may refer to and/or include the coil signals provided to the relay 205. The Relay 1 Output may refer to and/or include the contact signals provided by the relays 205. The second logic gate 305 and the third logic gate 305 are shown to receive similar signals corresponding to the relay 210 and the relay 215 respectively. The fourth logic gate 305 may receive a supply signal and an E-stop_ISO signal. The supply signal may correspond to a power supply signal and/or a reference signal. The E-stop_ISO signal may correspond to a signal produced by the E-stop system 120. For example, the E-stop_ISO signal may be a control signal generated by the E-stop system 120 to indicate activation of the E-stop system 120. While FIG. 3 shows the logic gates 305 as XOR (exclusive OR) gates, the logic gates 305 may include various logic gates and/or various types of logic gates.

In FIG. 3, the outputs of the first logic gate 305, the second logic gate 305, and third logic gate 305 are shown to be provided to the logic gate 310. The logic gate 310 is shown as a NOR (not OR) gate and the output of the logic gate 310 along with the output of the fourth logic gate 305 is shown to be provided to the logic gate 315. The logic gate 315 is shown as an OR gate. The logic gate 315 may provide an output (shown as DIAG in FIG. 3). The DIAG signal may be used by the vehicle 105 and/or various components thereof to detect that at least one relay of the relay junction 115 has been welded. For example, the processing circuit 110 may detect that one or more relays of the relay junction 115 have been welded based on the value of the DIAG signal. As another example, the processing circuit 110 may determine that the relay junction 115 is operating properly based on the value of the DIAG signal.

Figure 4:
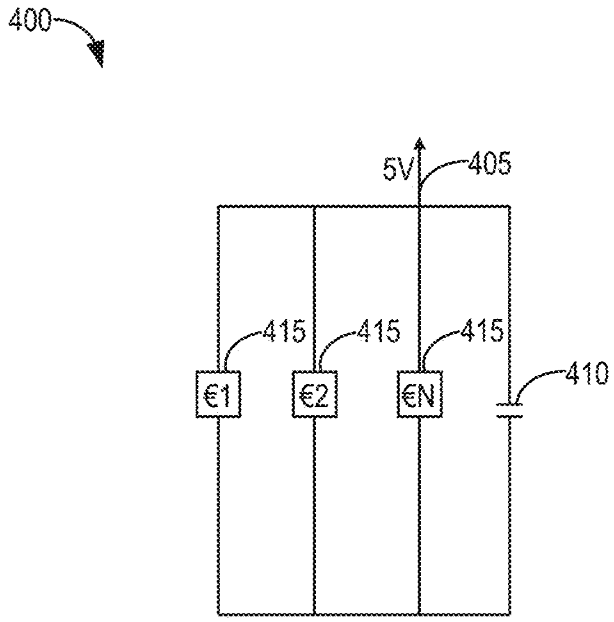
FIG. 4 is a schematic diagram of an equivalent circuit associated with one or more relays of the vehicle illustrated in FIG. 1, according to some embodiments.

FIG. 4 depicts a schematic diagram 400, according to some embodiments. The schematic diagram 400 may include and/or otherwise represent an equivalent circuit for one or more components of the vehicle 105. For example, the schematic diagram 400 may represent an equivalent circuit for the relays 205, 210, and 215. The schematic diagram 400 may also represent an equivalent circuit for the relay junction 115 and the E-stop system 120. In some embodiments, the schematic diagram 400 may include at least one power source 405, at least one parasitic element 410, and at least one field 415. The power source 405 may include the supply described herein. The power source 405 may include a rail and/or a voltage supply. The parasitic element 410 may include at least one of a resistor, an inductor, and/or a capacitor. The fields 415 may refer to and/or otherwise indicate at least one Electro Magnetic Field (EMF). For example, a first field 415 may refer to an EMF experienced by the relay 205.

Figure 5:
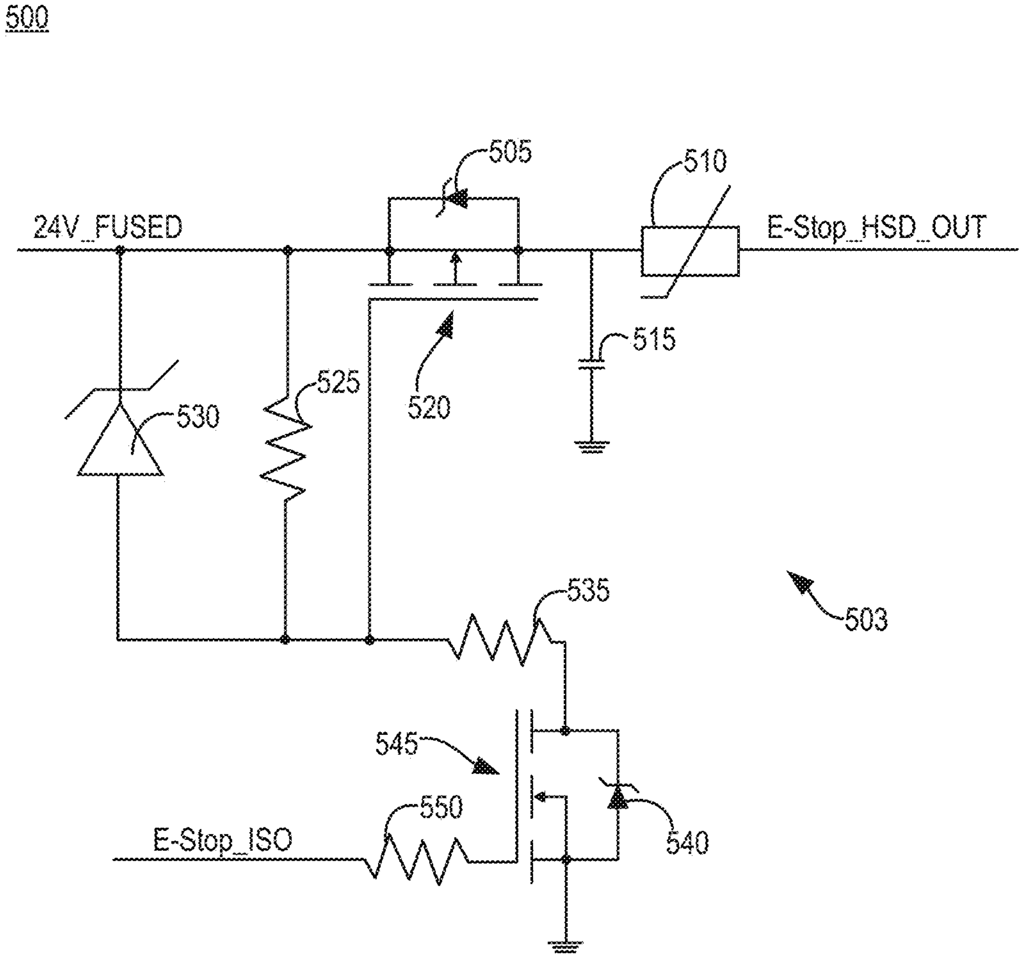
FIG. 5 is a schematic diagram of a High Side Driver (HSD) for use in an Emergency stop (E-stop) system, according to some embodiments.

FIG. 5 depicts a schematic diagram 500 of a High Side Driver (HSD) 503, according to some embodiments. The HSD 503 may be implemented and/or executed for use in the E-stop system 120. For example, the HSD 503 may produce and/or provide various signals with respect to the E-stop system 120. The HSD 503 may include various elements, components, and/or devices. The HSD 503 may include components 505, 510, 515, 520, 525, 530, 535, 540, 545, and 550. The components may receive and/or produce several signals. For example, the HSD 503 may receive the E-stop_ISO signal and the HSD 503 may provide an output signal (shown as E-Stop_HSD_OUT in FIG. 5). The HSD 503 may be electrically coupled with the various component of the vehicle 105. For example, the HSD 503 may be electrically coupled with the processing circuit 110.

Figure 6:
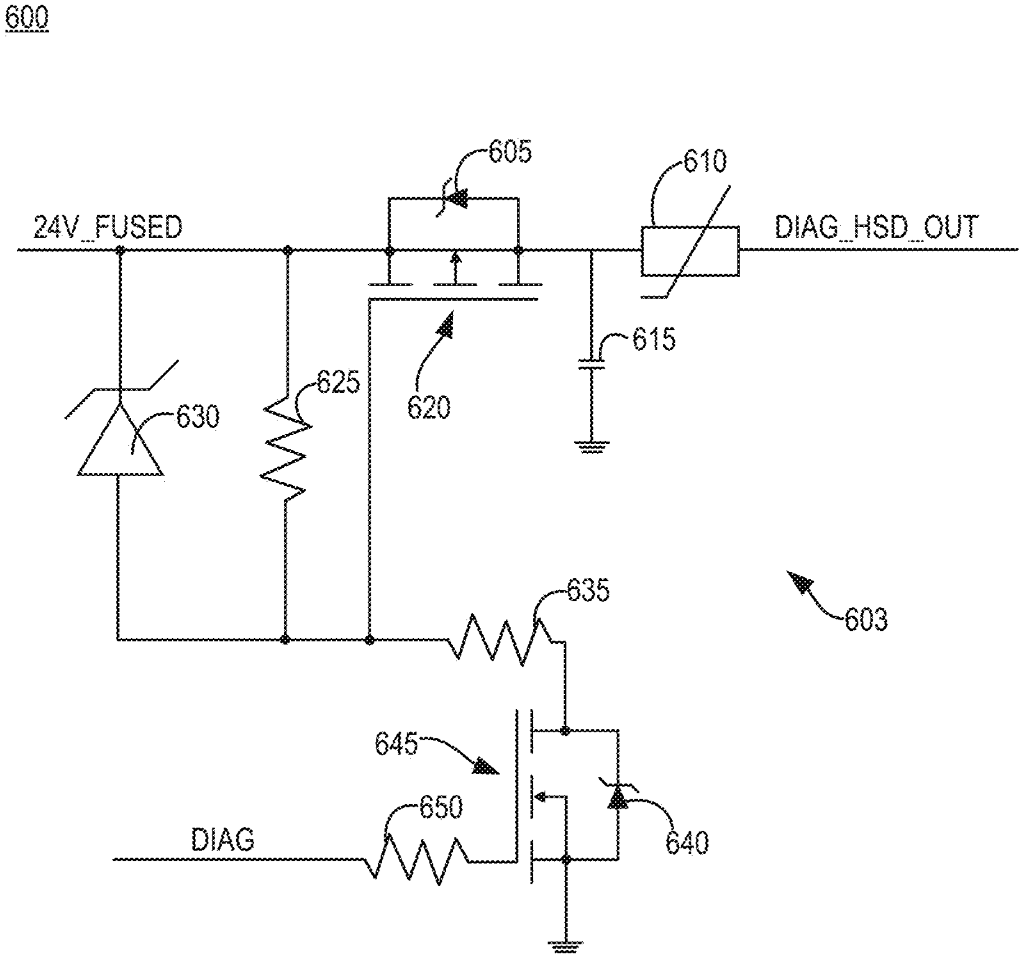
FIG. 6 is a schematic diagram of an HSD for use in detecting relay welds, according to some embodiments.

FIG. 6 is a schematic diagram 600 of an HSD 603, according to some embodiments. The HSD 603 may be implemented and/or executed by the vehicle 105 and/or various components thereof. The HSD 603 may include and/or perform similar functionality to that of the HSD 503. The HSD 603 may produce and/or provide various signals with respect to relay junction 115 and/or the E-stop system 120. The HSD may include various elements, components, and/or devices. The HSD 603 may include components 605, 610, 615, 620, 625, 630, 635, 640, 645, and 650. The components may receive and/or produce several signals. For example, the HSD 603 may receive the DIAG signal and the HSD 603 may provide an output signal (shown as DIAG_HSD_OUT in FIG. 5). The HSD 603 may be electrically coupled with various component of the vehicle 105.

FIG. 7 depicts a table 700, according to some embodiments. The table 700 can include various values and/or levels pertaining to the various signals described herein. For example, the table 700 may include levels (e.g., values, high, low, etc.) of the coil signals and the contact signals. The levels of the signals may be a binary value (e.g., 0 or 1). The levels may also include various other possible values. The table 700 may include at least one column and at least one row. The table 700 is shown to include columns pertaining to various signals. For example, the table 700 includes a column pertaining to ESTOP 1, a column pertaining to ESTOP 2, a column pertaining to AND, a column pertaining to IN x, a column pertaining to the OUT x, a column pertaining to XOR, a column pertaining to E-Stop_ISO, a column pertaining to E-Stop_DIAG, and a column pertaining to Relay Fault. In some embodiments, the rows of the table 700 may represent various possible signal level combinations. For example, the table 700 may be a truth table including various possible combinations of the signals described herein.

The AND column may represent a value and/or a level of a signal that is produced by providing the ESTOP 1 Signal and the ESTOP 2 signal to an AND gate. The XOR column may represent a value and/or a level of a signal that is produced by providing the IN x signal and the OUT x signal to an XOR gate. The IN x signal may represent the coil signals described herein. The OUT x signal may represent the contact signals described herein. The E-Stop_ISO signal may represent and/or correspond to the AND column. For example, a value of the E-stop_ISO corresponds to a result of providing ESTOP 1 and ESTOP 2 to an AND gate.

The E-Stop_DIAG column may represent when a relay has been welded. The value of the E-Stop_DIAG signal may have at least one logic rule and/or evaluation rule. For example, the value of the E-Stop_DIAG signal may be !((INx xor OUT x) AND E-Stop_ISO). As shown in FIG. 7, the E-Stop_DIAG signal having a value of 0 may indicate that a relay fault has occurred.

Figure 8:
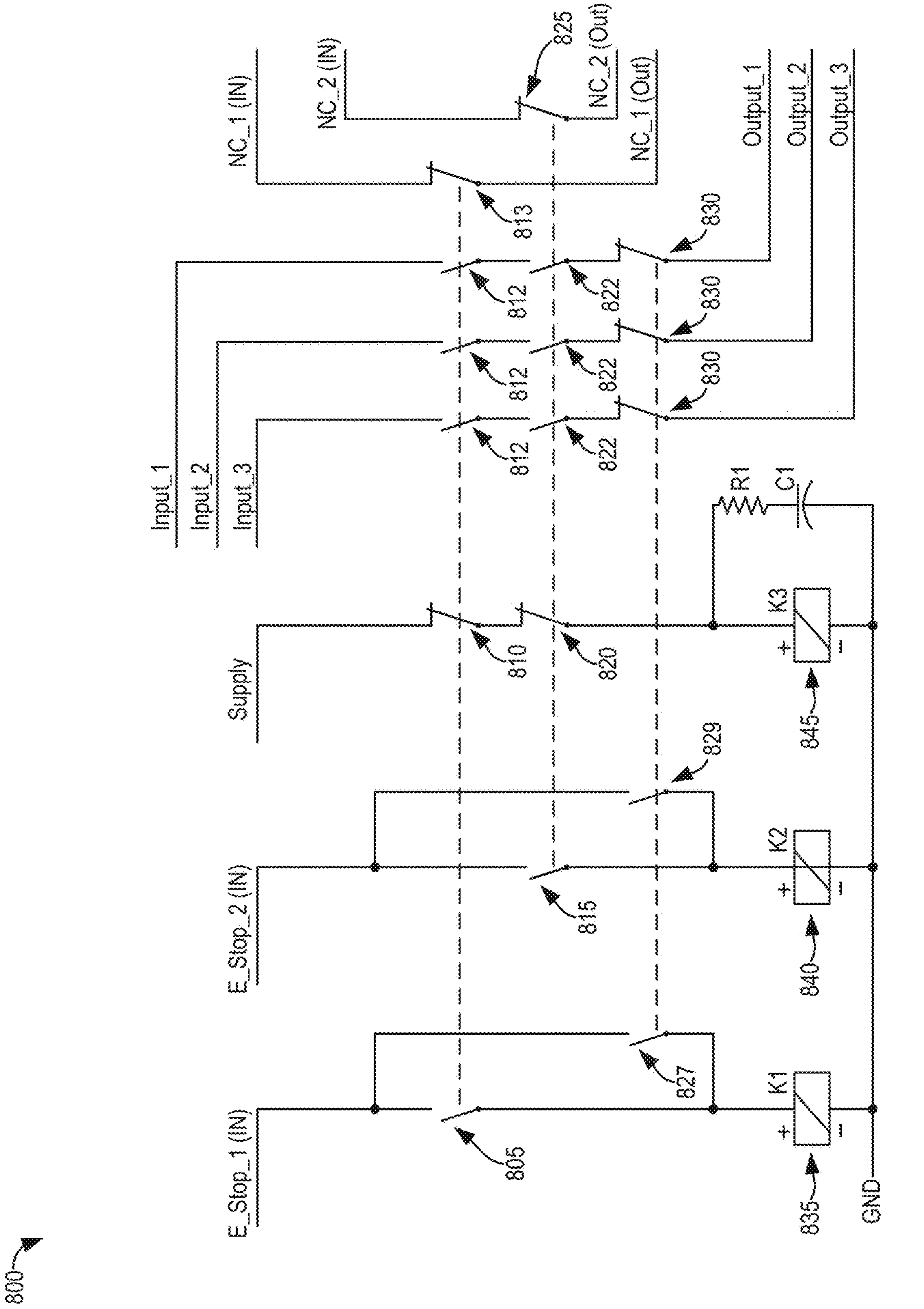
FIG. 8 is a schematic diagram of one or more relays included in the relay junction illustrated in FIG. 2, according to some embodiments.

FIG. 8 depicts a schematic diagram 800, according to some embodiments. In some embodiments, the schematic diagram 800 may represent or otherwise illustrate the relay junction 115. For example, the schematic diagram 800 may represent input signals or output signals of the relay junction 115. As shown in FIG. 8, the schematic diagram 800 includes multiple relays (shown as relays 805, 810, 812, 813, 815, 820, 822, 825, 827, 829, and 830). In some embodiments, the relays may include normally open relays and normally closed relays. For example, the relays 805 are shown as normally open relays. As another example, the relays 810 are shown as normally closed relays.

In some embodiments, the schematic diagram 800 may include coils 835, 840, and 845. As shown in FIG. 8, the coil 845 receives power from a supply given that relays 810 and 820 are normally closed. Stated otherwise, the default or idle state of the schematic diagram 800 includes the coil 845 receiving power from the supply (e.g., an energy storage device, a battery, a power system, etc.). In some embodiments, the relays 827 and 829 may close while the coil 845 is electrically coupled with the supply. For example, current may flow from the coil 845 to the relays 827 and 829 which causes the relays 827 and 829 to close. As another example, current may from the coil 845 to the coils 835 and 840. Stated otherwise, the coils 835 and 840 may be energized while the coil 845 is electrically coupled with the supply.

In some embodiments, operation or activation of the e-stop system 120 may cause activation and/or deactivation of the relays. For example, selection of a button of the e-stop system 120 may cause the e-stop system 120 to produce an E_Stop_1 (IN) signal and an E-Stop_2 (IN) signal. In some embodiments, the e-stop system 120 may include a two-pole system (e.g., a double pole switch, a double through switch, etc.). Stated otherwise, a single activation of the e-stop system 120 may cause the e-stop system 120 to produce the E_stop_1 (IN) signal and the E_stop_2 (IN) signal. As shown in FIG. 8, the E_Stop_1 (IN) signal is shown to manipulate the relays 805, 810, 812, and 813. For example, the E_Stop_1 (IN) signal may cause the relay 805 to close. As another example, termination or halt (e.g., signal is zero) of the E_Stop_1 (IN) signal may cause the relay 805 to open. As shown in FIG. 8, the E_Stop_2 (IN) signal is shown to manipulate the relays 815, 820, 822, and 825. In some embodiments, the various relays shown in FIG. 8 may include force guided relays. For example, the relay 805 may be prevented from opening if the relay 810 is stuck or welded in a close state.

As shown in FIG. 8, activation (e.g., closing) of the relay 805, via the E_Stop_1 (IN) signal, is shown to cause the relay 810 to open. Additionally, activation of the relay 815, via the E_Stop_2 (IN) signal, is shown to cause the relay 820 to open. In some embodiments, the opening of the relays 810 and 820 may electrically decouple the coil 845 from the supply. As shown in FIG. 8, activation of the relays 812 and 822 may electrically couple Input_1, Input_2, and Input_3 with Output_1, Output_2, and Output_3. In some embodiments, Input_1, Input_2, and Input_3 may represent and/or refer to control signals, power signals, or energizing signals. For example, Input_1 may represent electrical power from a power supply that, when received by a device, cause the device to perform an action. As a non-limiting example, the Input_1 may represent an energy signal that causes deactivation of a brake release system. In some embodiments, Input_1 may represent a signal strength prior to the relays 812, 822, and 830. In some embodiments, Output_1 may represent a signal strength after the relays 812, 822, and 830.

In some embodiments, the processing circuit 110 may monitor activation or deactivation of the relays by comparing input signals (Input_1, Input_2, and Input_3) with output signals (Output_1, Output_2, and Output_3) relative to E_Stop_1 (IN) and E_Stop_2 (IN). For example, the processing circuit 110 may monitor a value of Input_1 and Output_1 when E_Stop_1 (In) is high. As another example, the processing circuit 110 may monitor a value of Input_1 and Output_1 when E_Stop_1 (IN) is low. In some embodiments, the processing circuit 110 may detect failures in the e-stop system 120 based on the values of the input signals and the output signals relative to the E_Stop_1 (IN) signal and the E_stop_2 (IN) signal.

In some embodiments, the relays may be arranged or otherwise positioned such that failure in a single relay prevents subsequent operation of the vehicle 105. For example, as shown in FIG. 8, a failure in the relay 815 to open may prevent the relay 820 from closing. To continue this example, the prevention of the relay 820 from closing decouples the coil 845 from the supply. As a result, the relays 827 and 829 will remain open.

Figure 9:
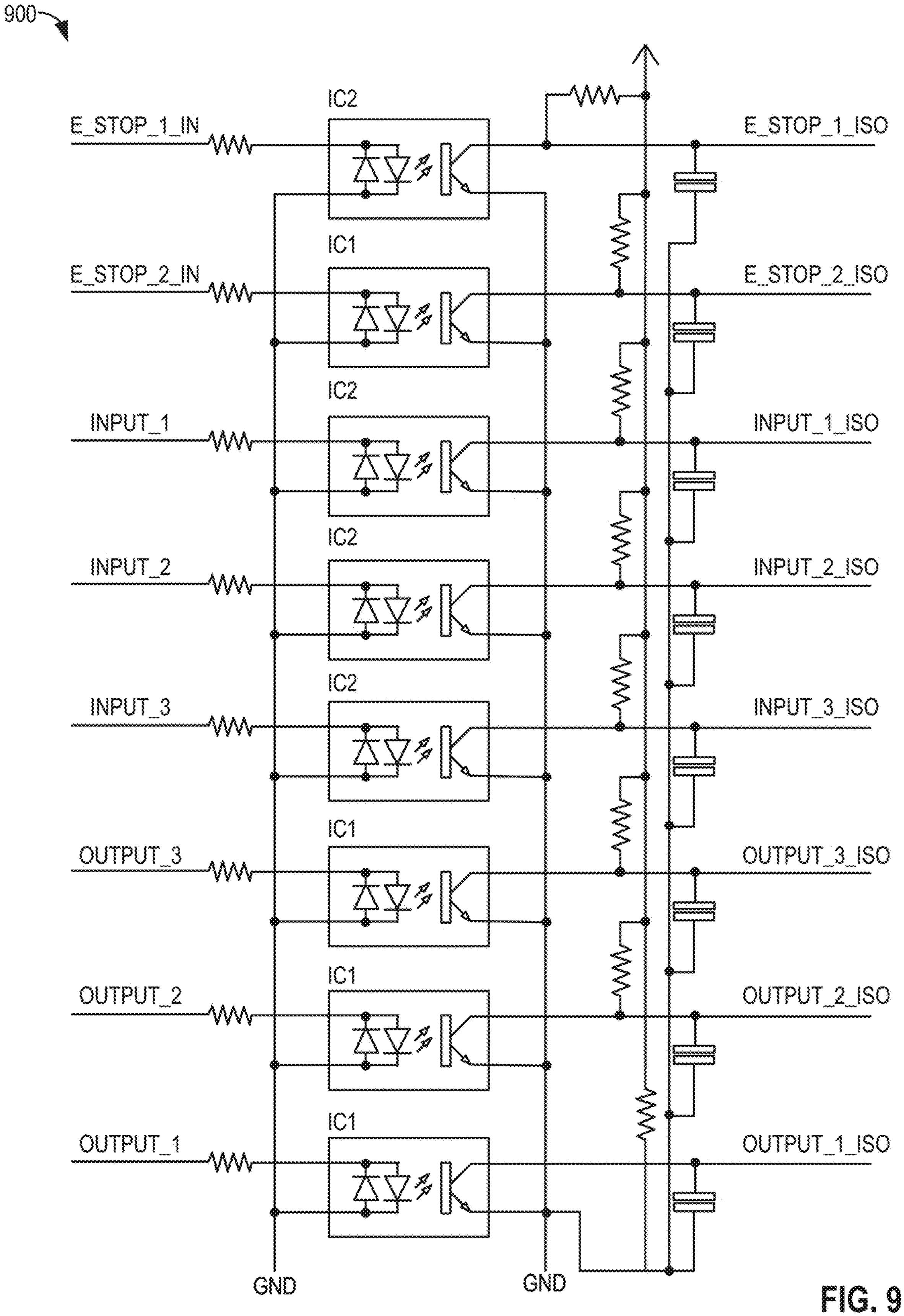
FIG. 9 is a schematic diagram of one or more signals to monitor performance of an e-stop relay system, according to some embodiments.

FIG. 9 is a schematic diagram 900 of one or more signals to monitor performance of an e-stop relay system, according to some embodiments. As shown in FIG. 9, the various signals of the schematic diagram 800 are shown as one or more inputs or one or more outputs to one or more integrated circuits (shown as IC2 and/or IC1 in FIG. 9). For example, E_Stop_1 (IN), E_Stop_2 (IN), Input_1, Input_2, Input_3, Output_1, Output_2, and Output_3 are all shown as inputs in the schematic diagram 900. As another example, E_Stop_1_ISO, E_Stop_2_ISO, Input_1_ISO, Input_2_ISO, Input_3_ISO, Output_1_ISO, Output_2_ISO, and Output_3_ISO are shown as outputs in the schematic diagram 900. In some embodiments, an optocoupler may provide the various input signals illustrated in FIG. 9.

In some embodiments, the processing circuit 110 may receive or otherwise detect the various signals illustrated in FIG. 9. For example, the processing circuit 110 may include the integrated circuits illustrated in FIG. 9. As another example, the processing circuit 100 may be communicably coupled with the integrated circuits illustrated in FIG. 9. In some embodiments, the processing circuit 110 may implement one or more truth tables to monitor the performance of the relay junction 115. For example, the processing circuit 110 may compare the values of the signals illustrated in FIG. 9 with the table 700.

Figure 10:
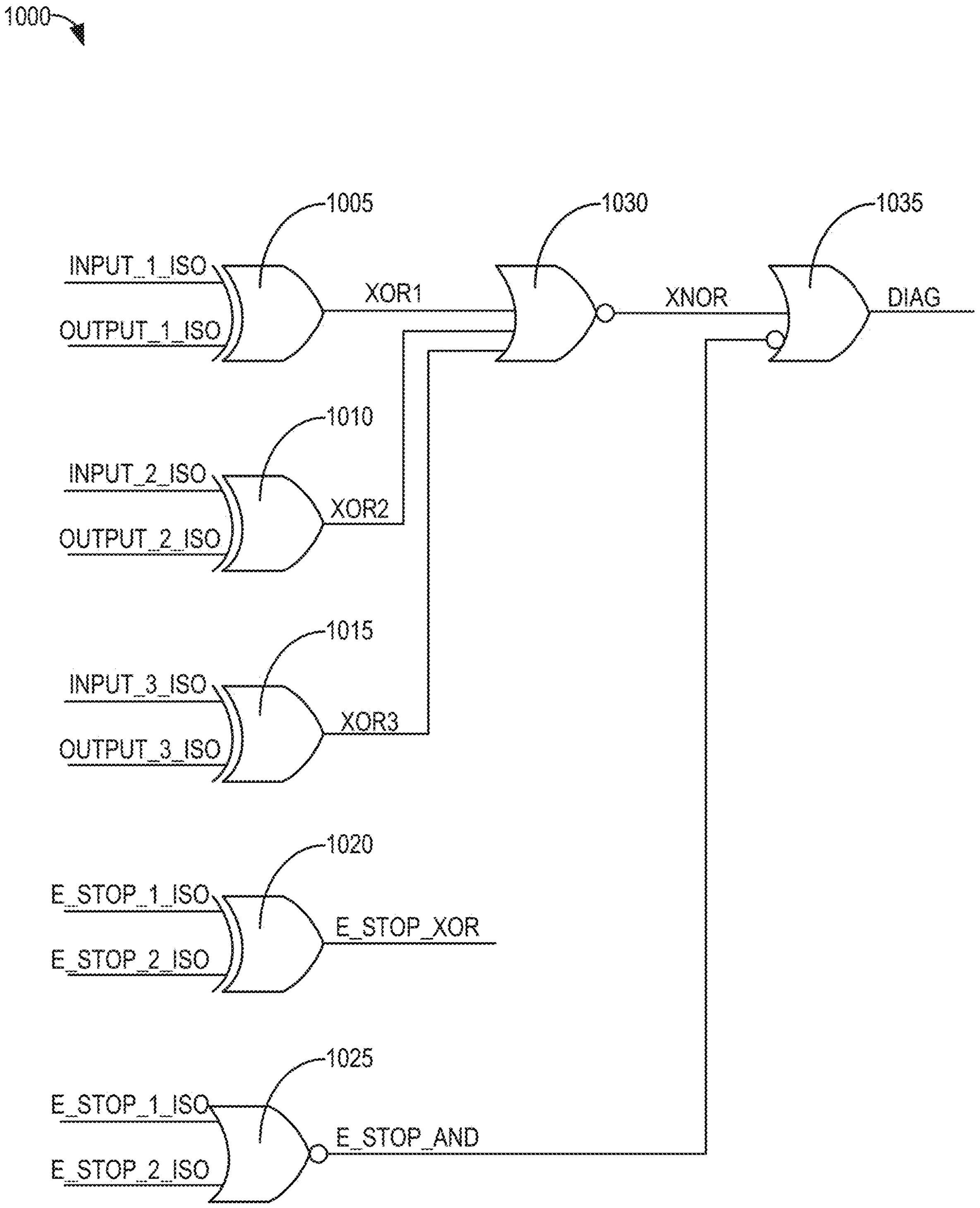
FIG. 10 is a schematic diagram of one or more components for comparing signals, according to some embodiments.

FIG. 10 depicts a schematic diagram 1000 of one or more components for comparing signals, according to some embodiments. In some embodiments, the processing circuit 110 may include or otherwise implement the schematic diagram 1000. For example, the processing circuit 110 may provide or otherwise input the various signals illustrated in FIG. 9 into gates 1005, 1010, 1015, 1020, and 1025. As shown in FIG. 10, the outputs of gates 1005, 1010, and 1015 are feed into a gate 1030. Additionally, the output of the gate 1030 and the output of the gate 1025 is feed into the gate 1035. As shown in FIG. 10, the outputs of the various gates may represent various signals described herein.

In some embodiments, the processing circuit 110 may compare outputs (e.g., a 0 or a 1) of the gates 1005, 1010, 1015, 1020, and 1025 with the inputs to detect failures. For example, a failure in the relay 812 to either open when activated or close when deactivate may cause Input_1 to be decoupled from Output_1 which may result in Input_1 and Output_1 not matching. In this example, the processing circuit 110 may detect the failure in relay 812 based on E_stop_1 (IN) being activated (e.g., set to 1), Input_1 being activated (e.g., set to 1), and based on Output_1 being deactivated (e.g., set to 0).

Figure 11:
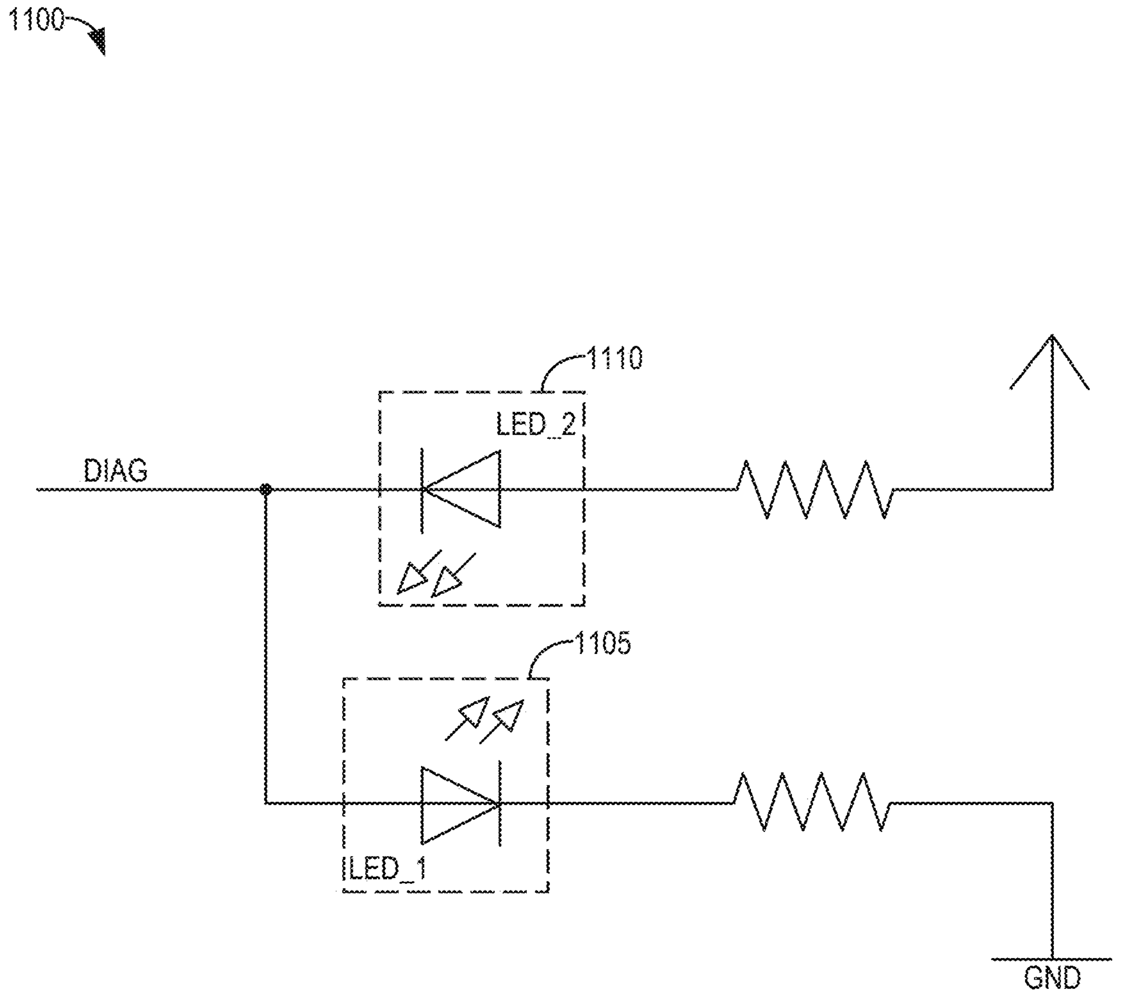
FIG. 11 is a schematic diagram of one or more components in communication with the relay junction illustrated in FIG. 2, according to some embodiments.
Figure 12:
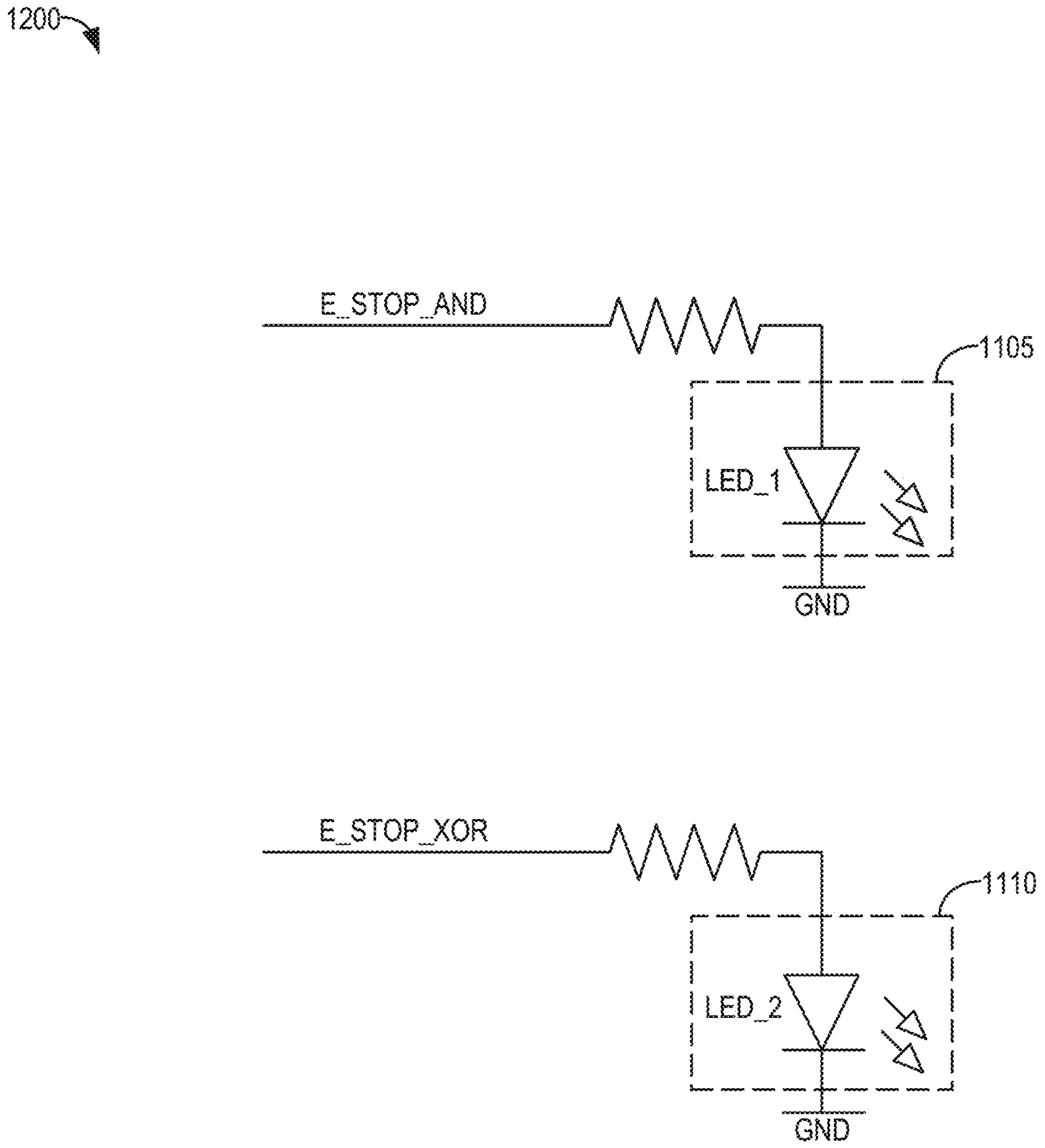
FIG. 12 is a schematic diagram of one or more components in communication with the relay junction illustrated in FIG. 2, according to some embodiments.

FIGS. 11-12 depict schematic diagrams 1100 and 1200 of one or more components in communication with the relay junction 115, according to some embodiments. As shown in FIG. 11, the schematic diagram 1100 includes one or more light sources (shown as light emitting diode (LED) 1105 and LED 1110 in FIG. 11). In some embodiments, the DIAG signal (e.g., the output of the gate 1035 or the gate 315) may control the LEDs 1105 and 1110. For example, when the DIAG signal goes high (e.g., set to 1) the LEDs 1105 and 1110 may produce light. As another example, when the DIAG signal goes low (e.g., set to 0) the LEDs 1105 and 1110 may halt or otherwise stop producing light.

As shown in FIG. 11, the LEDs 1105 and 1110 are arranged such that the DIAG signal is provide to the LEDs 1105. For example, when the DIAG signal is high, the LED 1105 may produce light. As another example, when the DIAG signal is low, the LED 1110 may produce light. In some embodiments, the processing circuit 110 may transmit or otherwise provide the DIAG signal to the LEDs 1105 and 1110.

In some embodiments, the LEDs 1105 and 1110 may be communicably coupled with one or more logic gates. For example, the LED 1105 may be electrically coupled with the gate 1035 such that the LED 1105 receives the output of the gate 1035 (e.g., the DIAG signal). In some embodiments, the LEDs 1105 and 1110 may produce light having one or more colors or illumination amounts. For example, the LED 1105 may produce light have a green color. As another example, the LED 1110 may produce light having a red color. In some embodiments, the LEDs 1105 and 1110 may produce light with a given color to provide a visual indication of the status of the relay junction 115. For example, the light may be green to indicate proper operation. As another example, the light may be red to indicate a failure. In some embodiments, the LEDs 1105 and 1110 may produce light with various illuminations amounts to indicate the status of the relay junction 115. For example, the LEDs 1105 and 1110 may flash or otherwise blink to indicate a failure. As another example, the LEDs 1105 and 1110 may produce constant amount of light to indicate proper operation.

As shown in FIG. 12, when the E_Stop_AND signal goes high the LED 1110 may produce light. As another example, when the E_Stop_AND signal goes low the LED 1110 may stop producing light. As another example, when the E_Stop_XOR signal goes high the LED 1105 may produce light. When the E_Stop_XOR signal goes low, the LED 1105 may stop producing light.

Figure 13:
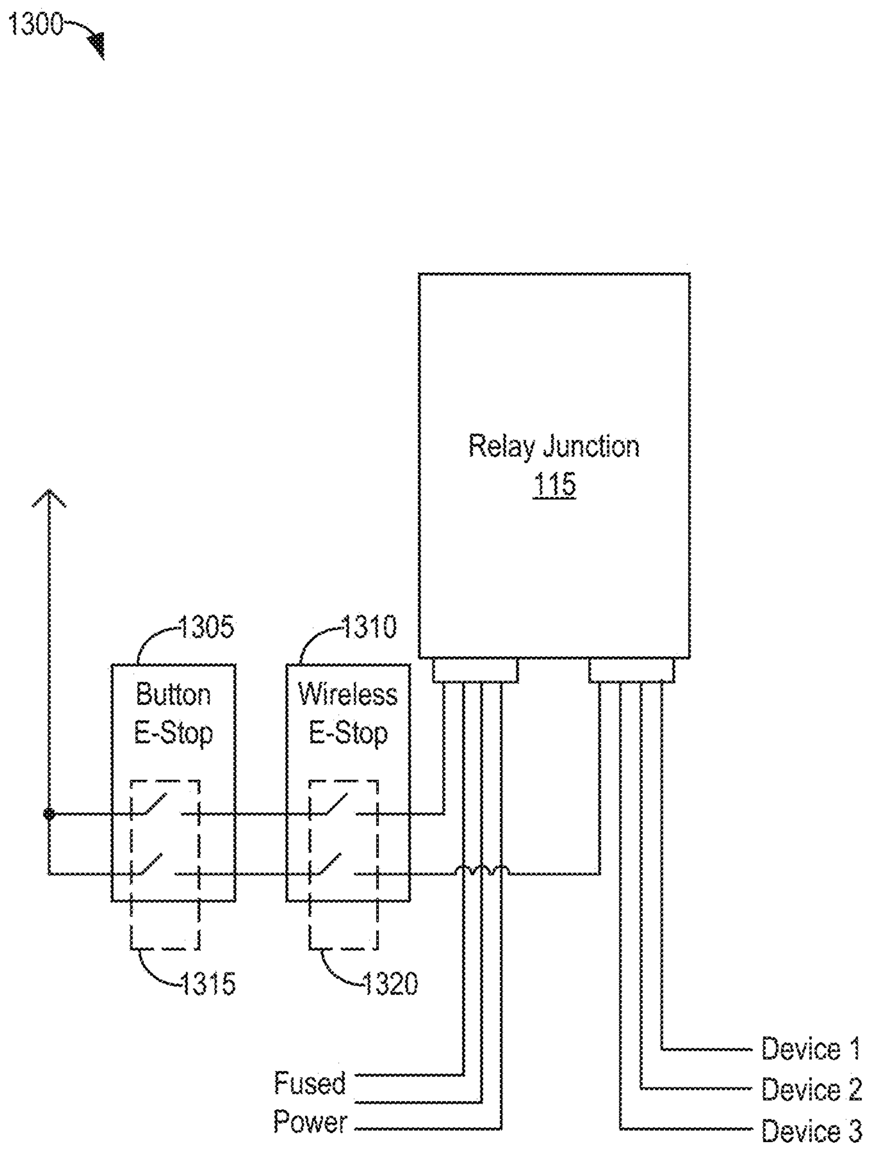
FIG. 13 is a block diagram of a system that includes an e-stop device and the relay junction illustrated in FIG. 2, according to some embodiments.

FIG. 13 depicts a block diagram of a system 1300, according to some embodiments. In some embodiments, the system 1300 may include the relay junction 115, a button e-stop 1305, and a wireless e-stop 1310. As shown in FIG. 13, the button e-stop 1305 may open or close one or more switches 1315. For example, activation or actuation of the button e-stop 1305 may open the switches 1315. As another example, the wireless e-stop 1310 may open one or more switches 1320. In this example, actuation of the wireless e-stop 1310 may open the switches 1320. In some embodiments, the switches 1315 and/or the switches 1320 may refer to and/or include the various relays, switches, and/or contacts described herein. In some embodiments, the button e-stop 1305 and/or the wireless e-stop 1310 may refer to or include one or more buttons of the e-stop system 120. For example, actuation of the button e-stop 1305 may activate the e-stop system 120.

Figure 14:
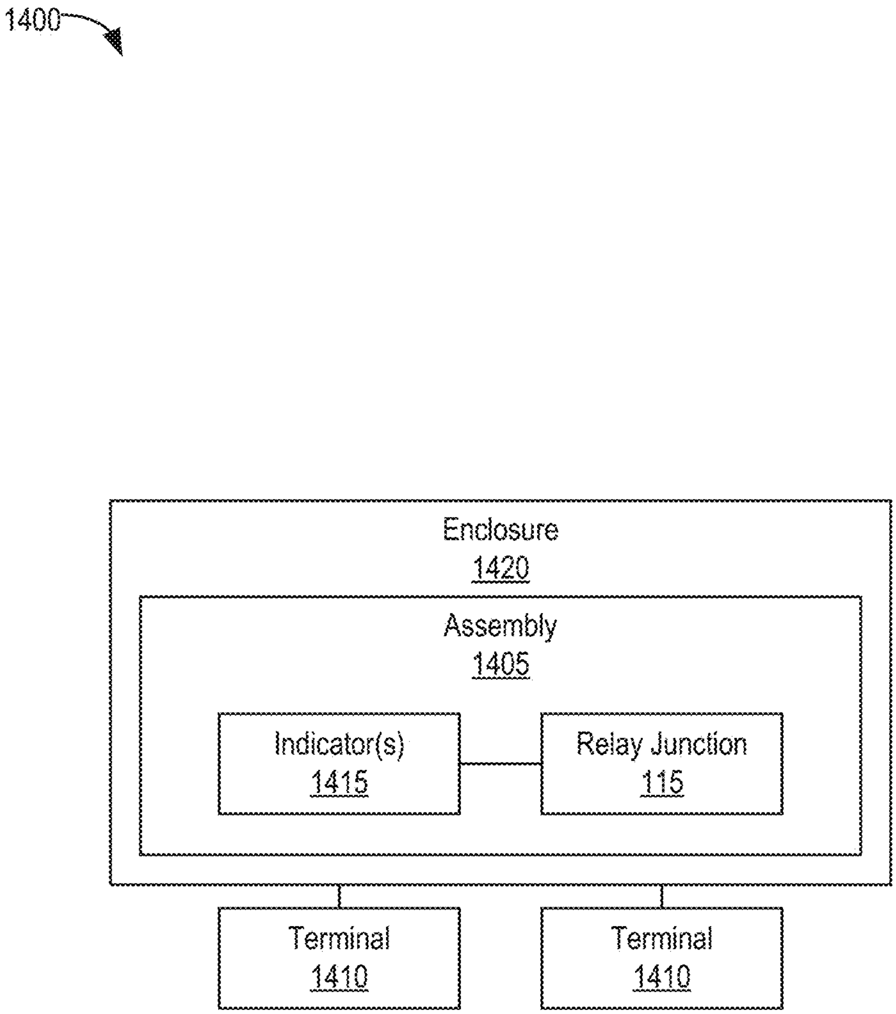
FIG. 14 is a block diagram of a relay device, according to some embodiments.

FIG. 14 is a block diagram of a relay device 1400, according to some embodiments. In some embodiments, the relay device 1400 and/or one or more components thereof may refer to or include an e-stop relay system. In some embodiments, the relay device 1400 may include at least one assembly 1405, at least one terminal 1410, at least one indicator 1415, and at least one enclosure 1420. In some embodiments, the assembly 1405 may define or establish a body for the relay device 1400. For example, the assembly 1405 may house one or more components of the relay device 1400. In some embodiments, the relay device 1400 may include one or more printed circuit boards (PCBs). For example, the assembly 1405 may house a PCB that includes the relay junction 115. In some embodiments, the relay device 1400 may include one or more products produced using additive manufacturing. In some embodiments, the indicators 1415 may refer to and/or include the LEDs 1105 and 1110.

In some embodiments, the assembly 1405 may include one or more openings or apertures to receive the terminals 1410. The terminals 1410 may electrically couple the relay device 1400 with one or more devices. For example, the terminals 1410 may electrically couple the relay junction 115 with the e-stop system 120. As another example, the terminals 1410 may electrically couple the relay junction 115 with the interface 125. In some embodiments, the enclosure 1420 may cover or otherwise surround the assembly 1405. For example, the enclosure 1420 may include a shield that surrounds the assembly 1405. In some embodiments, the enclosure 1420 may isolate the assembly 1405 from an external environment. For example, the enclosure 1420 may provide a waterproof seal for the assembly 1405.

Figure 15:
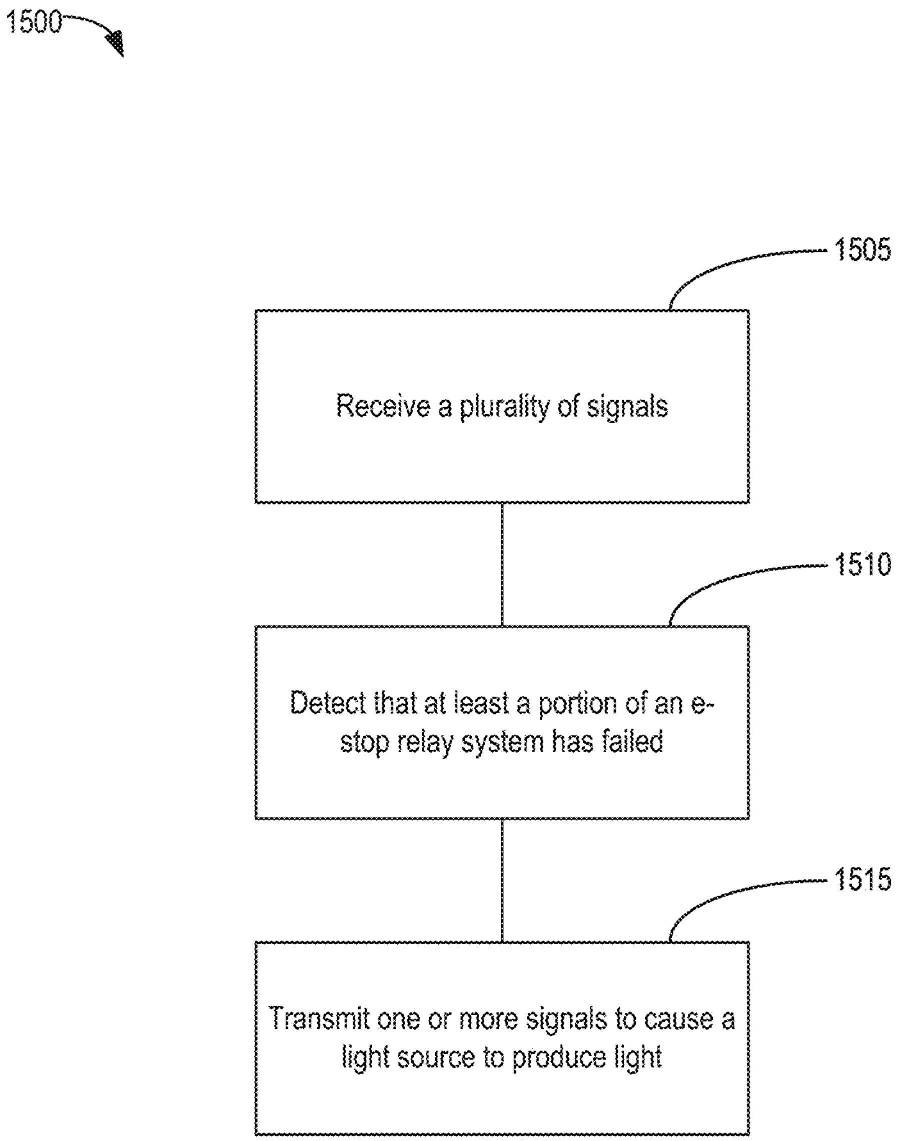
FIG. 15 is a flow diagram of a process to monitor performance of an e-stop relay system, according to some embodiments.

FIG. 15 depicts a flow diagram of a process 1500 to monitor a performance of an e-stop relay system, according to some embodiments. In some embodiments, the various systems, devices, and/or components described herein may perform at least one step of the process 1500. The process 1500 and/or one or more steps thereof may be adjusted, altered, changed, omitted, or otherwise modified. In some embodiments, the process 1500 and/or one or more steps thereof may be replicated, reproduced, repeated, or otherwise executed more than once.

In some embodiments, at step 1505, a plurality of signals may be received. For example, the processing circuit 110 may receive one or more signals from the relay junction 115. As another example, the processing circuit 110 may receive one or more signals illustrated in the schematic diagram 300 or the schematic diagram 1000. In some embodiments, the processing circuit 110 may receive the signals responsive to activation of the e-stop system 120. For example, selection of button e-stop 1305 may cause one or more signals to be transmitted to the processing circuit 110. As another example, the processing circuit 110 may receive one or more signals responsive to activation or deactivation of the various relays, switches, and contacts described herein.

In some embodiments, the plurality of signals may refer to and/or include the various signals described herein. For example, the plurality of signals may include the E_Stop_1 (IN). As another example, the signals may include the DIAG signal. In some embodiments, the processing circuit 110 may receive the plurality of signals sequentially. For example, the processing circuit 110 may receive a first signal, followed by a second signal. As another example, the processing circuit 110 may receive one or more signals at the same time.

In some embodiments, at step 1510, at least a portion of the e-stop relay system may be detected to have failed. For example, the processing circuit 110 may determine that relay 805 failed to close. As another example, the processing circuit 110 may determine that the DIAG signal, with reference to the table 700, indicates that one or more relays of the relay junction are not functioning properly.

In some embodiments, at step 1515, one or more signals may be transmitted to cause a light source to produce light. For example, the processing circuit 110 may transmit one or more signals to the LED 1105 to cause the LED 1105 to produce light. In some embodiments, the processing circuit 110 may transmit one or more signals to control the light produced by the light source. For example, the processing circuit 110 may transmit signals to cause the light source to produce blinking light. As another example, the processing circuit 110 may transmit signals to cause the light source to produce light having a given color.

In some embodiments, the processing circuit 110 may transmit, via the interface 125, one or more signals to a computing device. For example, the processing circuit 110 may transmit signals to a display within the vehicle 105. As another example, the processing circuit 110 may transmit signals to a controller or device that controls or otherwise operates the vehicle 105. In some embodiments, the processing circuit 110 may transmit signals to cause a user interface to display an indication that the at least one portion of the e-stop relay system has failed. For example, the processing circuit 110 may transmit signals to cause the display within the vehicle 105 to display an indication. The indication may indicate that the at least one portion of the e-stop relay system has failed. As another example, the processing circuit 110 may transmit signals to the controller to cause the controller to display the indication. In some embodiments, the processing circuit 110 may transmit signals to one or more additional devices, such as smart phones, tablets, wearable devices, computers, monitors, desktops, or other computing devices.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

References herein to the positions of elements (e.g., "top," "bottom," "above," "below") are merely used to describe the orientation of various elements in the figures. It should be noted that the orientation of various elements may differ according to other exemplary embodiments, and that such variations are intended to be encompassed by the present disclosure.

The hardware and data processing components used to implement the various processes, operations, illustrative logics, logical blocks, modules and circuits described in connection with the embodiments disclosed herein may be implemented or performed with a general purpose single- or multi-chip processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some embodiments, particular processes and methods may be performed by circuitry that is specific to a given function. The memory (e.g., memory, memory unit, storage device) may include one or more devices (e.g., RAM, ROM, Flash memory, hard disk storage) for storing data and/or computer code for completing or facilitating the various processes, layers and modules described in the present disclosure. The memory may be or include volatile memory or non-volatile memory, and may include database components, object code components, script components, or any other type of information structure for supporting the various activities and information structures described in the present disclosure. According to an exemplary embodiment, the memory is communicably connected to the processor via a processing circuit and includes computer code for executing (e.g., by the processing circuit or the processor) the one or more processes described herein.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

The invention claimed is:

1. An e-stop relay system, comprising:
- a relay junction including a relay to control an operation of a vehicle; and
- a circuit in communication with the relay junction, the circuit including a plurality of logic gates, the circuit configured to:
  - receive a plurality of signals that correspond to operation of the relay;
  - detect, using at least one signal of the plurality of signals, that at least one portion of the e-stop relay system has failed; and
  - transmit one or more signals to a light source to cause the light source to produce light that indicates that the at least one portion of the e-stop relay system has failed;
- a first logic gate of the plurality of logic gates communicably coupled with the light source such that the light source receives the one or more signals from the first logic gate; and
- wherein the light source is configured to produce light having a given color or illumination amount to indicate that the at least one portion of the e-stop relay system has failed.

2. The e-stop relay system of claim 1, comprising:
- the relay junction including a second relay coupled with the first relay;
- the relay and the second relay controllable by the plurality of signals; and the relay and the second array arranged such that failure in the at least one portion of the e-stop relay prevents the operation of the vehicle.

3. The e-stop relay system of claim 1, comprising:

the relay junction including a second relay having one or more terminals;

the one or more terminals of the second relay coupled with one or more terminals of the relay; and the one or more terminals of the second relay configured to receive one or more control signals to control the operation of the vehicle responsive to detecting that the at least one portion of the e-stop relay system has failed.

4. The e-stop relay system of claim 1, wherein the at least one portion of the e-stop relay system includes the relay, and wherein the circuit is configured to detect that the at least one portion of the e-stop relay system has failed in response to the relay being welded.

5. The e-stop relay system of claim 1, wherein the circuit is configured to:

compare a first signal of the plurality of signals pertaining to a first portion of the e-stop relay system of the vehicle with a second signal of the plurality of signals pertaining to a second portion of the e-stop relay system of the vehicle; and determine, responsive to comparison of the first signal with the second signal, that a difference between the first signal and the second signal indicates that the at least one portion of the e-stop relay system has failed.

6. The e-stop relay system of claim 1, wherein the circuit is configured to:

determine, based on a difference between the at least one signal of the plurality of signals and at least one second signal of the plurality of signals, that at least one second portion of the e-stop relay system of the vehicle has also failed; and prevent, responsive to detection that the at least one portion of the e-stop relay system of the vehicle has failed and that the at least one second portion of the e-stop relay system has also failed, the operation of the vehicle.

7. The e-stop relay system of claim 1, comprising:

the relay including one or more coils coupled with one or more contacts of a second relay of the relay junction; and the second relay configured to receive, via the one or more contacts, one or more control signals intended for the relay responsive to a failure in the relay.

8. The e-stop relay system of claim 1, where the operation of the vehicle pertains to at least one of operating a payload of the vehicle or a weaponry action.

9. The e-stop relay system of claim 1, wherein the vehicle is an unmanned ground vehicle.

10. The e-stop relay system of claim 1, wherein the vehicle is a combat vehicle.

11. The e-stop relay system of claim 1, wherein the vehicle is an access equipment vehicle.

12. The e-stop relay system of claim 1, wherein the circuit is configured to:

transmit one or more second signals to a device of the vehicle or a user device that controls the vehicle, the one or more second signals to cause a user interface to display an indication that the at least one portion of the e-stop relay system has failed.

* * * * *